US009525117B2

(12) United States Patent
Tansu et al.

(10) Patent No.: US 9,525,117 B2
(45) Date of Patent: Dec. 20, 2016

(54) THERMOELECTRIC MATERIALS BASED ON SINGLE CRYSTAL AlInN—GaN GROWN BY METALORGANIC VAPOR PHASE EPITAXY

(75) Inventors: Nelson Tansu, Bethlehem, PA (US); Hua Tong, Allentown, PA (US); Jing Zhang, Bethlehem, PA (US); Guangyu Liu, Bethlehem, PA (US); Gensheng Huang, Bethlehem, PA (US)

(73) Assignee: LEHIGH UNIVERSITY, Bethlehem, PA (US)

( * ) Notice: Subject to any disclaimer, the term of this patent is extended or adjusted under 35 U.S.C. 154(b) by 274 days.

(21) Appl. No.: 12/963,136

(22) Filed: Dec. 8, 2010

(65) Prior Publication Data

US 2011/0240082 A1 Oct. 6, 2011

Related U.S. Application Data

(60) Provisional application No. 61/267,525, filed on Dec. 8, 2009.

(51) Int. Cl.
*H01L 35/14* (2006.01)
*H01L 35/22* (2006.01)
*H01L 21/02* (2006.01)

(52) U.S. Cl.
CPC ........... *H01L 35/22* (2013.01); *H01L 21/0237* (2013.01); *H01L 21/0242* (2013.01); *H01L 21/0254* (2013.01); *H01L 21/0262* (2013.01); *H01L 21/02458* (2013.01)

(58) Field of Classification Search
CPC ............. H01L 21/0237; H01L 21/0242; H01L 21/02458; H01L 21/0254; H01L 21/0262; H01L 35/22
See application file for complete search history.

(56) References Cited

U.S. PATENT DOCUMENTS

| | | | | |
|---|---|---|---|---|
| 6,468,882 | B2 * | 10/2002 | Motoki | ................... C30B 25/02 257/E21.131 |
| 7,521,629 | B2 | 4/2009 | Yamaguchi et al. | |
| 7,566,580 | B2 | 7/2009 | Keller et al. | |
| 2002/0056840 | A1 * | 5/2002 | Tsai | ..................... H01L 21/0237 257/78 |

(Continued)

FOREIGN PATENT DOCUMENTS

WO 2009/060736 A1 5/2009
WO 2009/117847 A1 10/2009

OTHER PUBLICATIONS

Definition of "Lattice Matched Structure" as provided by Semi1Source, (http://www.semi1source.com/glossary/default.asp?searchterm=lattice+matched+structure), accessed on Mar. 15, 2015.*

(Continued)

*Primary Examiner* — Golam Mowla
(74) *Attorney, Agent, or Firm* — Saul Ewing LLP (57) ABSTRACT

The invention is a thermoelectric device fabricated by growing a single crystal AlInN semiconductor material on a substrate, and a method of fabricating same. In a preferred embodiment, the semiconductor material is AlInN grown on and lattice-matched to a GaN template on a sapphire substrate, and the growth is performed using metalorganic vapor phase epitaxy (MOVPE).

22 Claims, 11 Drawing Sheets

(56) References Cited

U.S. PATENT DOCUMENTS

| | | | |
|---|---|---|---|
| 2005/0103257 A1* | 5/2005 | Xu | C30B 25/02 117/84 |
| 2005/0229963 A1 | 10/2005 | He et al. | |
| 2006/0151801 A1 | 7/2006 | Doan et al. | |
| 2007/0034838 A1 | 2/2007 | Imaoka et al. | |
| 2007/0111488 A1 | 5/2007 | Chakraborty et al. | |
| 2007/0234946 A1 | 10/2007 | Hashimoto et al. | |
| 2008/0229549 A1 | 9/2008 | Fiegelson et al. | |
| 2008/0258133 A1* | 10/2008 | Seong | H01L 33/04 257/14 |
| 2008/0259980 A1 | 10/2008 | Wierer et al. | |
| 2009/0127581 A1* | 5/2009 | Ou | H01L 21/0237 257/103 |
| 2009/0140296 A1 | 6/2009 | Park et al. | |
| 2009/0165837 A1 | 7/2009 | Park et al. | |
| 2009/0184342 A1 | 7/2009 | Iza et al. | |
| 2009/0224240 A1* | 9/2009 | Shinagawa | B82Y 20/00 257/43 |

OTHER PUBLICATIONS

Grundmann et al., "Blue InGaN Quantum Well LED Fabrication," pp. 1-16 (May 8, 2002).

Tong et al., Applied Physics Letters, 97, 112105 (2010).

S. Yamaguchi, Y. Iwamura, and A. Yamamoto, Appl. Phys. Lett., 82, 2065 (2003).

S. Yamaguchi, R. Izaki, K. Yamagiwa, K. Taki, Y. Iwamura, and A. Yamamoto, Appl. Phys. Lett., 83, 5398 (2003).

S. Yamaguchi, R. Izaki, N. Kaiwa, S. Sugimura and A. Yamamoto, Appl. Phys. Lett., 84, 5344 (2004).

S. Yamaguchi, R. Izaki, Y. Iwamura, and A. Yamamoto, Physica Stat. Solidi (a), 201, 225 (2004)).

B. N. Pantha, R. Dahal, J. Li, J. Y. Lin, H. X. Jiang, and G. Pomrenke, Appl. Phys. Lett., 92, 042112 (2008).

B. N. Pantha, R. Dahal, J. Li, J. Y. Lin, H. X. Jiang, and G. Pomrenke, J. Electro. Mater., 38, 1132 (2009).

\* cited by examiner

THERMOELECTRIC MATERIALS BASED ON SINGLE CRYSTAL AlINN—GAN GROWN BY METALORGANIC VAPOR PHASE EPITAXY

CROSS-REFERENCE TO RELATED APPLICATIONS

This application claims priority to U.S. Provisional Application No. 61/267,525, filed Dec. 8, 2009, the entire contents of which are hereby incorporated fully by reference.

STATEMENT REGARDING FEDERALLY SPONSORED RESEARCH OR DEVELOPMENT

This invention was made with government support under U.S. National Science Foundation DMR # 0907260, ECCS # 0701421. The government has certain rights in the invention.

BACKGROUND OF THE INVENTION

High power density requirements in III-Nitride lasers and light-emitting diodes, transistors, and solar cells has led to the demand for solid state cooling technology, in particular, for nitride-based alloys that can be integrated with GaN devices. In recent years thermoelectric devices have drawn significant attention due to their use in electronic cooling and heat recycling for electric power generation. A thermoelectric device creates a voltage when there is a different temperature on each side of the device. Conversely when a voltage is applied to it, it creates a temperature difference (known as the Peltier effect). This effect can be used to generate electricity, to measure temperature, and to heat or cool objects. Because the direction of heating and cooling is determined by the polarity of the applied voltage, thermoelectric devices make very convenient temperature controllers.

Much materials and structures research has been undertaken with respect to thermoelectric devices and the number of device applications has grown dramatically. The thermoelectric and device cooling applications of III-Nitride based alloys is yielding some promising results because they are non-toxic, highly thermally stable and radiation proof. III-Nitride devices in particular have been widely applied in high power, high temperature environments, and efficient thermal management is required for such broad applications in photonics, optoelectronics and electronics.

The thermoelectric properties for RF-sputtered AlInN have been reported (see, e.g., S. Yamaguchi, Y. Iwamura, and A. Yamamoto, *Appl. Phys. Lett.*, 82, 2065 (2003); S. Yamaguchi, R. Izaki, K. Yamagiwa, K. Taki, Y. Iwamura, and A. Yamamoto, *Appl. Phys. Lett.*, 83, 5398 (2003); S. Yamaguchi, R. Izaki, N. Kaiwa, S. Sugimura and A. Yamamoto, *Appl. Phys. Lett.*, 84, 5344 (2004); and S. Yamaguchi, R. Izaki, Y. Iwamura, and A. Yamamoto, *Physica Stat. Solidi (a)*, 201, 225 (2004)), as have the thermoelectric properties for MOVPE-grown InGaN (see, e.g., B. N. Pantha, R. Dahal, J. Li, J. Y. Lin, H. X. Jiang, and G. Pomrenke, *Appl. Phys. Lett.*, 92, 042112 (2008), and B. N. Pantha, R. Dahal, J. Li, J. Y. Lin, H. X. Jiang, and G. Pomrenke, *J. Electro. Mater.*, 38, 1132 (2009)).

AlInN prepared by an RF-sputtering method (leading to polycrystalline AlInN material) results in a material that has a poor $Z^*T$ value (=0.005, T=300K), which is unacceptable for thermoelectric devices. MOVPE-grown InGaN results in a single crystal InGaN material that has a poor Seebeck coefficient, which is also unacceptable for use in thermoelectric devices.

SUMMARY OF THE INVENTION

The invention is a thermoelectric material fabricated by growing a single crystal AlInN semiconductor material on a substrate, and a method of fabricating same. In a preferred embodiment, the semiconductor material is AlInN grown on and lattice-matched to a GaN template on a sapphire substrate, and the growth is performed using metalorganic vapor phase epitaxy (MOVPE).

BRIEF DESCRIPTION OF THE DRAWINGS

FIG. 3 illustrates (a) the set up for the thermal gradient method for Seebeck voltage measurements of AlInN samples; (b) Seebeck voltage as a function of the temperature difference and (c) measured Seebeck coefficients for $Al_{1-x}In_xN$ alloys with various In-content (x) from x=0.11 up to x=0.2134 at T=300K;

FIG. 5 illustrates (a) a cross sectional schematic of a four-probe 3ω measurement set up for n-$Al_{1-x}In_xN$ films grown on GaN/sapphire template prepared with $SiO_2$ insulation layer; and (b) a top microscope image of the four-probe 3ω measurement set up for n-$Al_{1-x}In_xN$ films;

FIG. 6 illustrates (a) measured voltage $V_\omega$ and in-phase $V_{3\omega}$; and (b) measured temperature oscillation amplitude ($T_{ac}$) as a function of frequency in logarithm scale for n-$Al_{0.83}In_{0.17}N$ sample with n=$5.1 \times 10^{18}$ cm$^{-3}$ and undoped GaN/sapphire reference sample at 300 K;

FIG. 7 illustrates (a) measured voltage $V_\omega$ and in-phase $V_{3\omega}$; and (b) measured temperature oscillation amplitude ($T_{ac}$) as a function of frequency in logarithm scale for n-$Al_{0.83}In_{0.17}N$ sample with n=$1.6 \times 10^{18}$ cm$^{-3}$ and undoped GaN/sapphire reference sample at 300 K;

FIG. 8 illustrates (a) measured voltage $V_\omega$ and in-phase $V_{3\omega}$; and (b) measured temperature oscillation amplitude ($T_{ac}$) as a function of frequency in logarithm scale for n-$Al_{0.79}In_{0.21}N$ sample with n=$2.2 \times 10^{18}$ cm$^{-3}$ and undoped GaN/sapphire reference sample at 300 K;

FIG. 9 illustrates (a) measured voltage $V_\omega$ and in-phase $V_{3\omega}$; and (b) measured temperature oscillation amplitude ($T_{ac}$) as a function of frequency in logarithm scale for n-$Al_{0.89}In_{0.11}N$ sample with n=$1.1 \times 10^{18}$ cm$^{-3}$ and undoped GaN/sapphire reference sample at 300 K;

DETAILED DESCRIPTION

A preferred embodiment, and results of testing various aspects of same, is now presented. In accordance with this preferred embodiment, an AlInN film is grown, using MOCVD, on an undoped GaN (e.g., 2.8 μm)/sapphire substrate. The growth of the GaN template on the sapphire substrate is performed using a 30-nm low temperature (e.g., $T_g=535°$ C.) GaN buffer, and then is followed by a high temperature (e.g., $T_g=1080°$ C.) GaN growth. The background n-type carrier concentration of the GaN template employed is $5 \times 10^{16}$ cm$^{-3}$. The growth temperature of the n-$Al_{1-x}In_xN$ alloys (e.g., ~200 nm thick) is in a range between 750-790° C. with a growth pressure of 20 Torr. The result of the above-described process is a single-crystal semiconductor material formed on the substrate.

In this embodiment, TMIn (trimethylindium) and TMAl (trimethylaluminum) are used as group III precursors, and $NH_3$ is used as a group V precursor. The epitaxy can be conducted in a VEECO P75 low-pressure vertical MOVPE reactor with a high rotation (e.g., 1500 rpm) of the wafer carrier. Purified hydrogen (H2) and nitrogen (N2) can be used as the carrier gas. The sapphire substrate (e.g., an C-plane sapphire epi-ready substrate) is annealed to remove any residual impurities on the surface in H2 ambient at 1070° C. for 3 min prior to the growth. The AlInN epilayer is grown in nitrogen ambient with a growth rate of 2.5 nm/min, a growth pressure of 20 Torr, a growth temperature range of 750-850° C., a rotating speed of 1500 rpm, and an input ratio (V/III ratio) of 9000.

Once formed as above, the surface morphology of AlInN was checked using optical microscopy. The lattice constant of an AlInN epilayer was measured by X-ray diffraction (XRD). The Hall measurement of the AlInN using Van der Pauw method gives an n-type background carrier density of $6.3 \times 10^{18}$ cm$^{-3}$ ($n_{2D}=1.0 \times 10^{14}$ cm$^{-2}$) and an electron mobility of 289 cm$^2$/(Vs).

In additional embodiments, multiple growths were performed in which the In content of the resultant AlInN alloys grown by MOCVD was varied. Then, the thermoelectric properties of the resultant growths were measured and recorded. The thermoelectric properties of the $Al_{1-x}In_xN$ alloys, grown by MOVPE, with In-contents (x) from 11% up to 21.34% were characterized and analyzed at room temperature. The thermoelectric figure of merit (Z*T) values of the n-$Al_{1-x}In_xN$ alloys were measured as high as 0.391 up to 0.532 at T=300K. The use of a high In-content (e.g., x=21.34%) AlInN alloy led to significant reduction in thermal conductivity [κ=1.62 W/(mK)] due to increased alloy scattering, however, the optimized thermoelectric material was obtained for AlInN alloy with In-content of 17% attributed to its large power factor.

Figure 1:
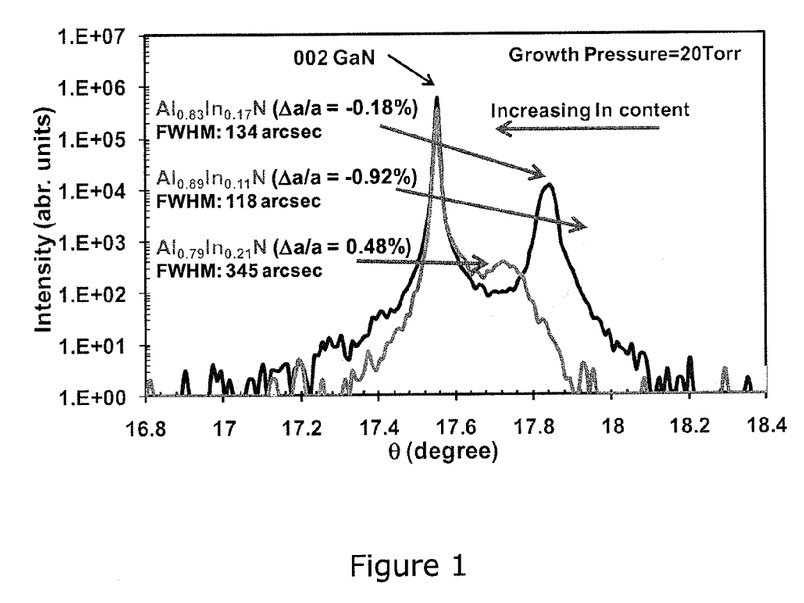
FIG. 1 illustrates XRD rocking curves in c-axis for n-$Al_{1-x}In_xN$ thin films grown on GaN/sapphire template.

The In-contents (x) of $Al_{1-x}In_xN$ epilayers were measured by X-ray diffractometer (XRD) for c-axis orientation, resulting in x=0.11, 0.17, and 0.2134 (FIG. 1). The lattice-mismatch strain in the a-axis (Δa/a) between $Al_{1-x}In_xN$ alloys and GaN as a function of In-content (x) are shown in FIG. 1. As the In-content in $Al_{1-x}In_xN$ alloys reached ~17% ($Al_{0.83}In_{0.17}N$), the Δa/a was measured as −0.18% which corresponded to a nearly lattice-matched layer. For $Al_{0.83}In_{0.17}N$ alloys, the growth temperature and V/III ratio were 780° C. and 9300, respectively. For $Al_{0.89}In_{0.11}N$ and $Al_{0.79}In_{0.21}N$ alloys, the growth temperatures were 790° C. and 750° C., respectively.

The increasing FWHM of the XRD rocking curves for AlInN with higher In-content can be attributed to the increasing phase separation in the film. Crack-free films were obtained for lattice-matched (x=17%) and compressively-strained (x=21.34%) samples, while cracks were observed in tensile-strained samples (x=11%). It was found that in addition to AlInN alloys with In content of 17% (which is considered a lattice-matched condition), "nearly lattice-matched" alloys (In content from 15% to 19%) still result in high quality materials that function well as thermoelectric materials.

III. Electrical Conductivities and Seebeck Coefficients of AlInN Alloys

Figure 2:
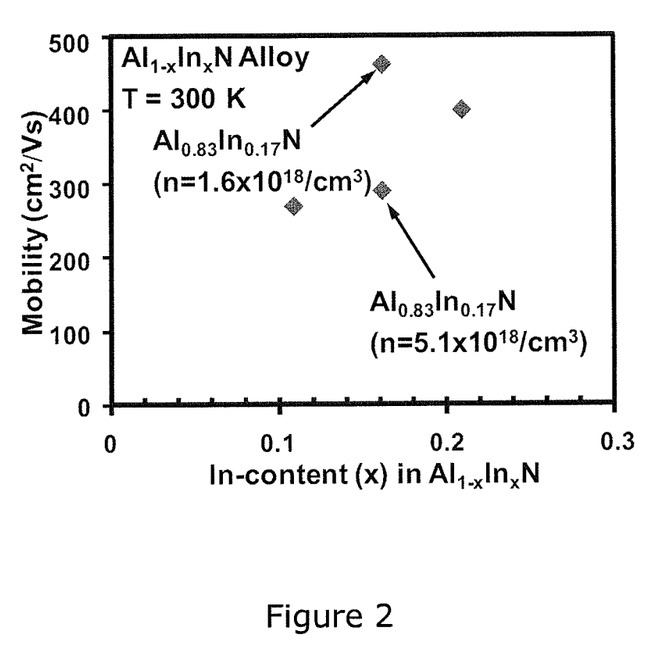
FIG. 2 illustrates the measured electron mobility for $Al_{1-x}In_xN$ alloys with various In-content (x) from x=0.11 up to x=0.2134 at T=300K.

The carrier mobilities of n-$Al_{1-x}In_xN$ alloys created as described above were measured by the Hall method, as shown in FIG. 2. The background n-type carrier concentrations for two $Al_{0.83}In_{0.17}N$ samples were measured as $5.1 \times 10^{18}$ cm$^{-3}$ and $1.6 \times 10^{18}$ cm$^{-3}$, respectively. For $Al_{0.89}In_{0.11}IN$ and $Al_{0.79}In_{0.21}N$ alloys, the background n-type carrier concentrations were measured as $1.1 \times 10^{18}$ cm$^{-3}$ and $2.2 \times 10^{18}$ cm$^{-3}$, respectively. The carrier mobilities were measured as 290 cm$^2$/(Vs) and 462 cm$^2$/(Vs) for $Al_{0.83}In_{0.17}N$ (n=$5.1 \times 10^{18}$ cm$^{-3}$) and $Al_{0.83}In_{0.17}N$ (n=$1.6 \times 10^{18}$ cm$^{-3}$), respectively. The results show that higher carrier density leads to higher electrical conductivity and lower electron mobility. Despite its relatively low carrier concentration, the $Al_{0.89}In_{0.11}N$ sample exhibits lower carrier mobility, which can be attributed to the cracks in the film. The cracks in the $Al_{0.89}In_{0.11}N$ thin film are related to the dislocation density from the growths of tensile film on the GaN template. With higher cracking density, the dominant crystal dislocation scattering reduces the electron mobility in AlInN alloy.

Figure 3:
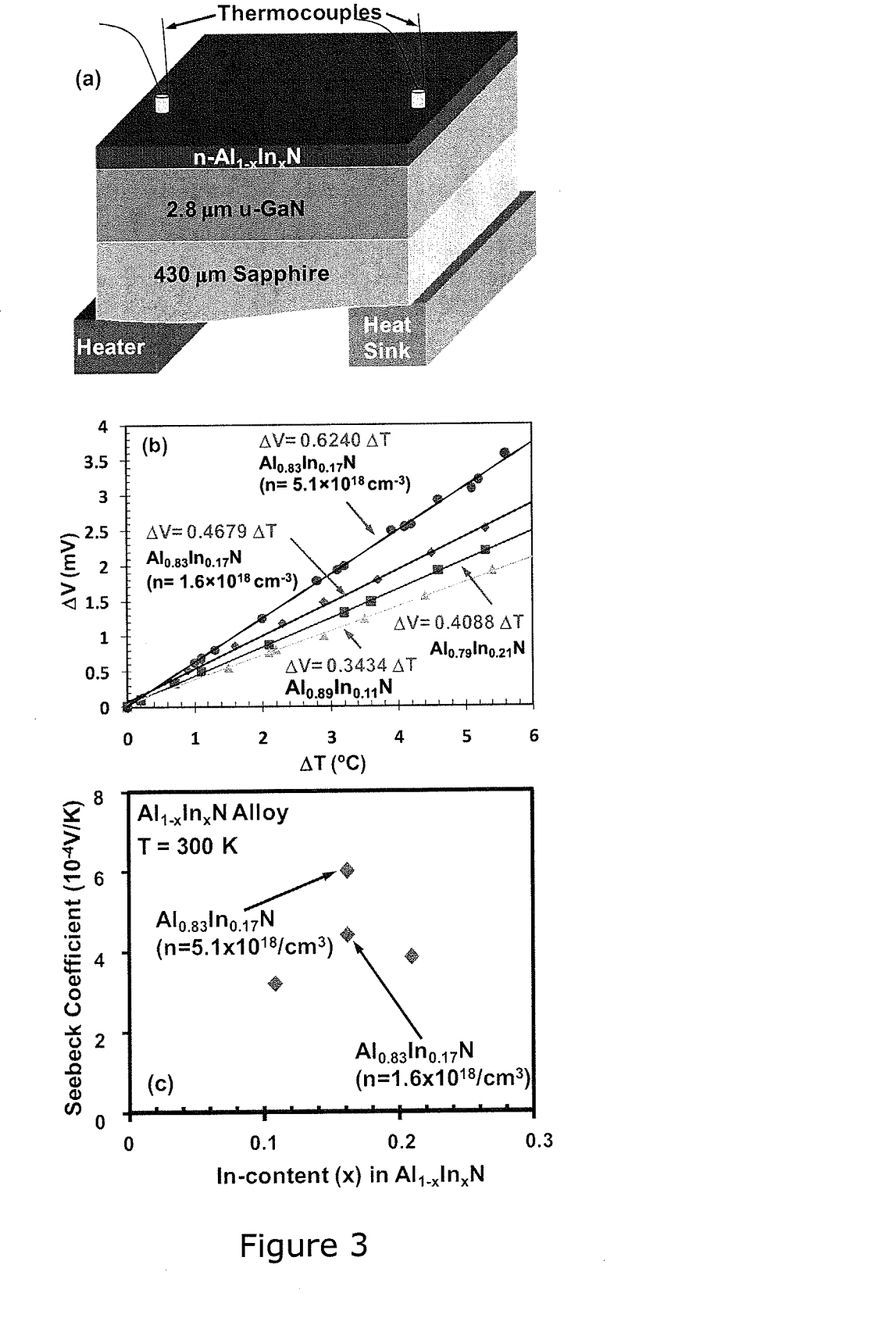

The Seebeck coefficients were determined by a thermal gradient method, as illustrated in FIG. 3(a). When a temperature gradient was created in the sample, both the voltage difference and temperature difference were measured. A hotplate was used to create the high temperature. Two type K thermocouples were attached to the top surface of an AlInN sample via indium (In) metal to measure any temperature difference. The Seebeck voltage was collected from the positive chromel electrodes of the thermocouples at the same time. FIG. 3(b) shows the measured Seebeck voltages as a function of the temperature difference for $Al_{1-x}In_xN$ alloys with various In-content (x) from x=0.11 up to x=0.2134 at T=300K. The Seebeck voltages for all the $Al_{1-x}In_xN$ samples show good linearity with the measured temperature difference. The measured Seebeck voltages in FIG. 3(b) refer to the total Seebeck coefficients of AlInN and chromel electrodes combined. The corresponding Seebeck coefficients for AlInN films need to be compensated by the Seebeck coefficient of chromel at room temperature (21.5 μV/K). The Seebeck coefficients of $Al_{1-x}In_xN$ alloys are shown in FIG. 3(c). The absolute Seebeck coefficients for the AlInN alloys are relatively large, which are in the range of $-3.2 \times 10^{-4}$ V/K up to $-6.012 \times 10^{-4}$ V/K, with the highest value measured for n-$Al_{0.83}In_{0.17}N$ alloy (n=$5.1 \times 10^{18}$ cm$^{-3}$).

Figure 4:
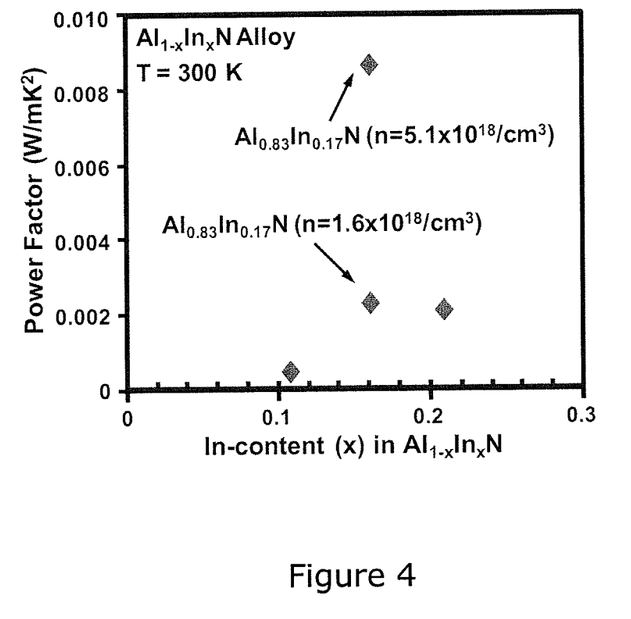
FIG. 4 illustrates the measured power factors for $Al_{1-x}In_xN$ alloys with various In-content (x) from x=0.11 up to x=0.2134 at T=300K.

FIG. 4 shows the measured power factors (P=$S^2\sigma$) for $Al_{1-x}In_xN$ alloys with x=0.11-0.2134 at T=300 K. The power factors for $Al_{0.89}In_{0.11}N$ (n=$1.1 \times 10^{18}$ cm$^{-3}$) and $Al_{0.79}In_{0.21}N$ (n=$2.2 \times 10^{18}$ cm$^{-3}$) were measured as $4.77 \times 10^{-4}$ W/(mK$^2$) and $2.11 \times 10^{-3}$ W/(mK$^2$), respectively. The higher power factors were obtained for the n-$Al_{0.83}In_{0.17}N$ alloys, which were $8.64 \times 10^{-3}$ W/(mK$^2$) and $2.30 \times 10^{-3}$ W/(mK$^2$) for n=$5.1 \times 10^{18}$ cm$^{-3}$ and n=$1.6 \times 10^{18}$ cm$^{-3}$, respectively. The large power factors for the $Al_{0.83}In_{0.17}N$ alloys are attributed to the large electrical conductivities and Seebeck coefficients. Note that both Seebeck coefficient and electrical conductivity have dependencies on carrier concentration, which in turn lead to the power factor variation with carrier concentration.

IV. Thermal Conductivities Characterizations of AlInN Alloys

Figure 5:
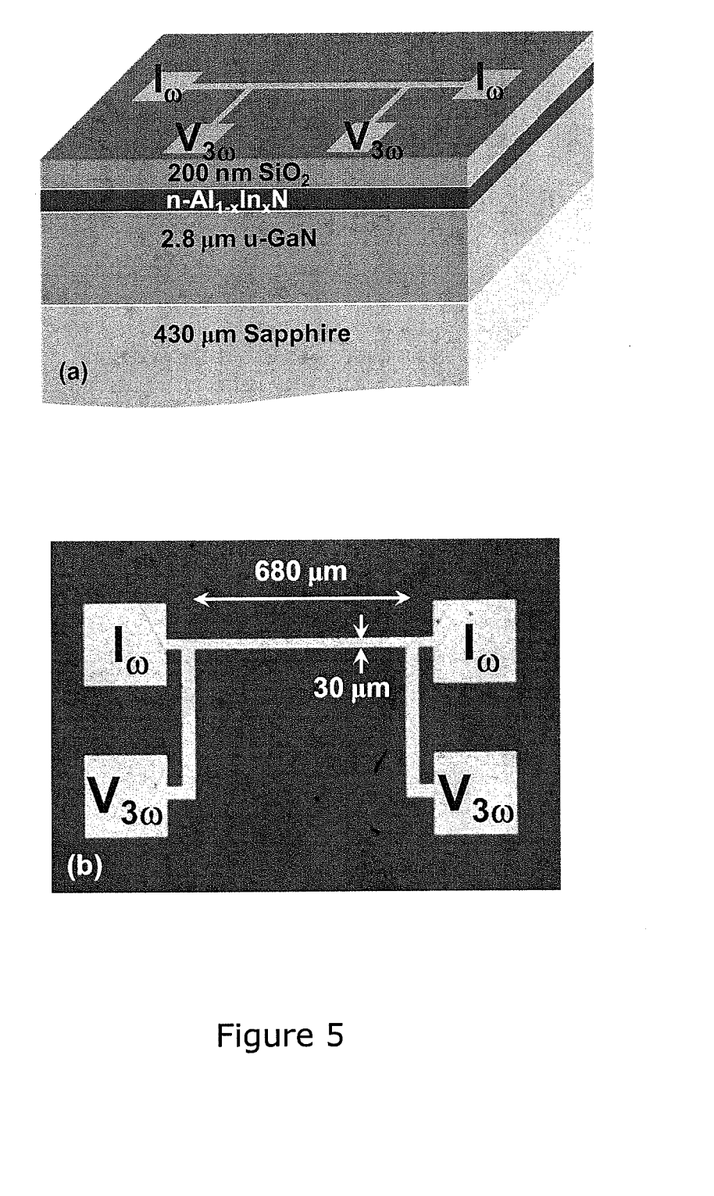

The thermal conductivities of the AlInN films were measured by employing the 3ω differential method as described, for example, in H. Tong, J. Zhang, G. Liu, J. A. Herbsommer, G. S. Huang, and N. Tansu, *Appl. Phys. Lett.*, 97, 112105 (2010). A cross sectional schematic of a four-probe 3ω measurement set-up for n-$Al_{1-x}In_xN$ films grown on GaN/sapphire template prepared with $SiO_2$ insulation layer is shown in FIG. 5(a). The insulating layers of 200 nm $SiO_2$ were deposited by plasma-enhanced chemical vapor deposition on the AlInN/GaN/sapphire samples, and the metal heater contacts of 20 nm Ti/130 nm Au were deposited by using an electron beam evaporator. The top microscope image of the four-probe 3ω measurement set up for n-$Al_{1-x}In_xN$ films is shown in FIG. 5(b).

In this 3ω measurement set-up, a digital lock-in amplifier SR830 was employed to supply the driving AC current ($I_\omega$) with sweeping frequency w and collect the voltage ($V_\omega$) as well as the third harmonic voltage ($V_{3\omega}$) of the metal stripe. A digital multimeter (HP 34401A) was used to measure the current in order to obtain the metal heater resistance. All the 3ω measurements were performed at room temperature. The 3ω measurement set up was calibrated by measuring the thermal conductivities of sapphire and $SiO_2$ using differential and slope methods. For calibration purposes, the thermal conductivities of sapphire and $SiO_2$ (T=300K) were obtained as 41 W/(mK) and 1.1 W/(mK), respectively.

Figure 6:
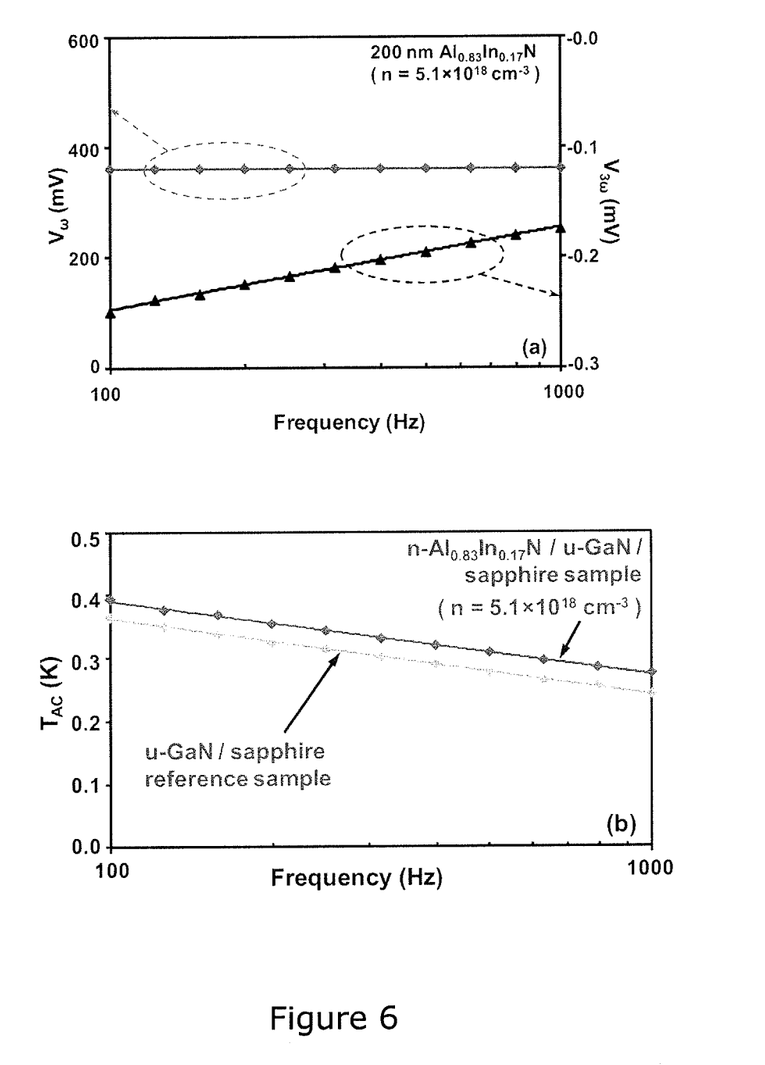
Figure 7:
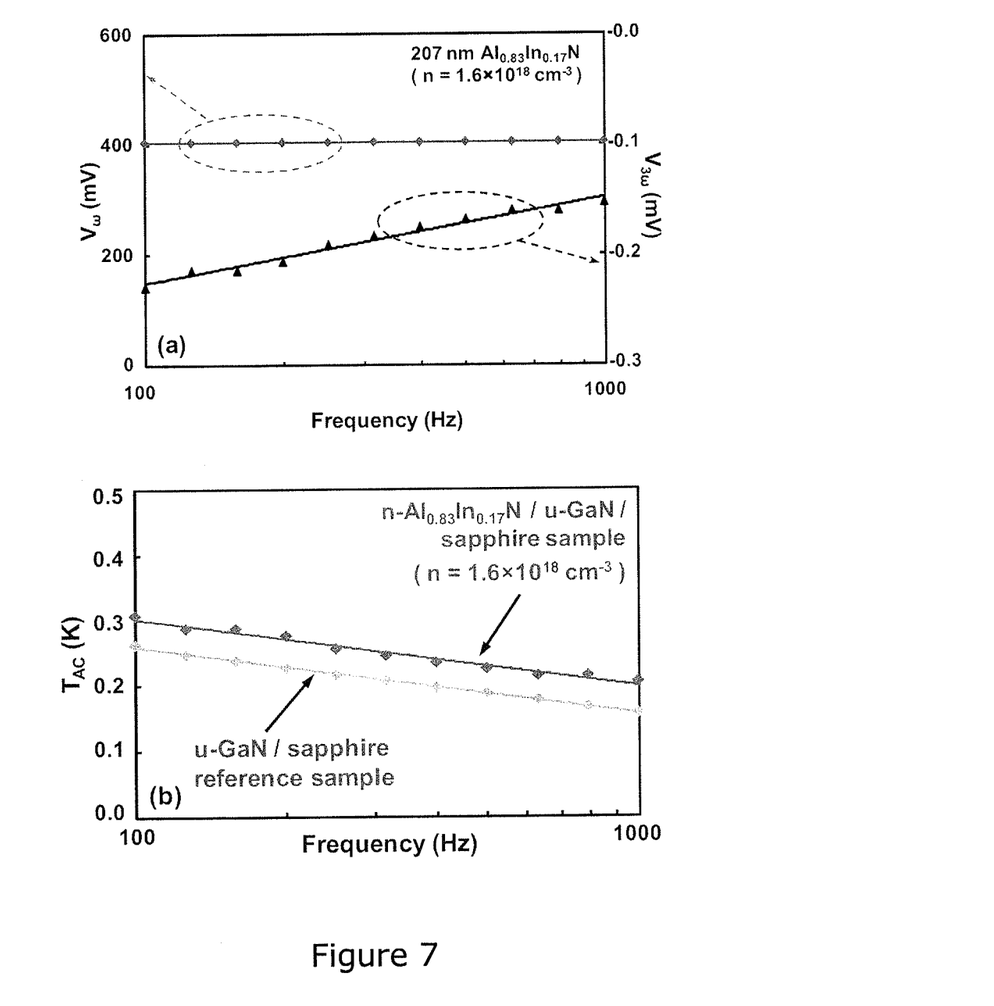
Figure 8:
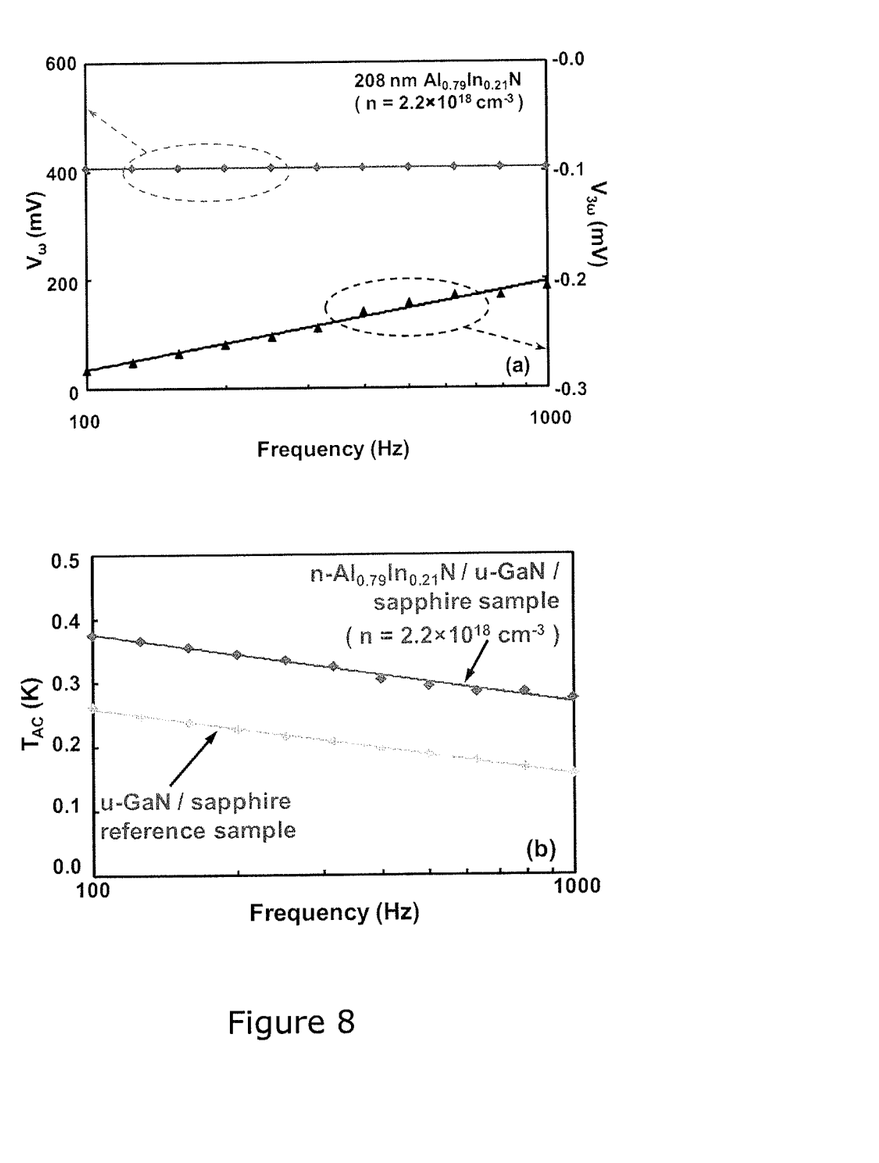
Figure 9:
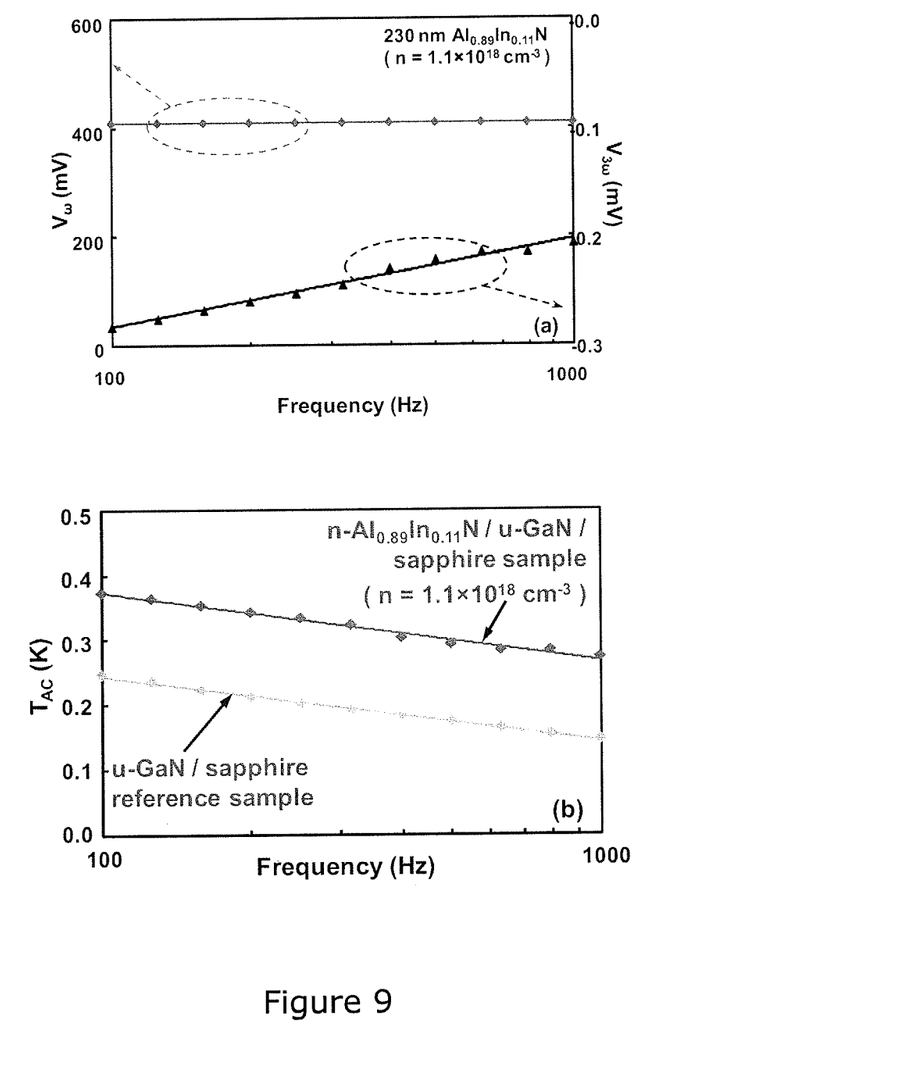

Both the measured voltage $V_\omega$ and in-phase $V_{3\omega}$ of the undoped GaN reference sample and the n-$Al_{1-x}In_xN$ samples at T=300K are shown in FIG. 6(a) (n-$Al_{0.83}In_{0.17}N$ sample with $n=5.1\times10^{18}$ cm$^{-3}$), FIG. 7(a) (n-$Al_{0.83}In_{0.17}N$ sample with $n=1.6\times10^{18}$ cm$^{-3}$), FIG. 8(a) (n-$Al_{0.79}In_{0.21}N$ sample with $n=2.2\times10^{18}$ cm$^{-3}$), and FIG. 9(a) (n-$Al_{0.89}In_{0.11}N$ sample with $n=1.1\times10^{18}$ cm$^{-3}$). The sweeping frequency of the driving current (ω/2π) ranged from 100 Hz to 1000 Hz, which insured the thermal penetration depth to be larger than the thickness of thin film while smaller than the thickness of the substrate.

The $V_\omega$ and in-phase $V_{3\omega}$ of the undoped GaN template on sapphire were measured as reference samples. To insure consistency in the measurements, all the GaN template reference samples correspond to identical templates used for the growths of n-$Al_{1-x}In_xN$ samples.

The temperature oscillation amplitude $T_{AC}$ for the samples can be extracted from both the $V_\omega$ and $V_{3\omega}$ by using the following relation:

$$T_{AC} = 2\frac{V_{3\omega}}{V_\omega}\frac{dT}{dR}R. \tag{1}$$

The temperature oscillation amplitudes $T_{AC}$ as a function of frequency in a logarithmic scale from 100 Hz to 1000 Hz for both the undoped GaN reference sample and the n-$Al_{1-x}In_xN$ samples at T=300K are shown in FIG. 6(b) (n-$Al_{0.83}In_{0.17}N$ sample with $n=5.1\times10^{18}$ cm$^{-3}$), FIG. 7(b) (n-$Al_{0.83}In_{0.17}N$ sample with $n=1.6\times10^{18}$ cm$^{-3}$), FIG. 8(b) (n-$Al_{0.79}In_{0.21}N$ sample with $n=2.2\times10^{18}$ cm$^{-3}$), and FIG. 9(b) (n-$Al_{0.89}In_{0.11}N$ sample with $n=1.1\times10^{18}$ cm$^{-3}$). Therefore, the temperature rise $\Delta T_{AC}$ was obtained by subtracting the $T_{AC}$ of the undoped GaN reference sample from the n-$Al_{1-x}In_xN$ samples. The average value of $\Delta T_{Ac}$ for the entire frequency range (from 100 Hz-1000 Hz) was used to calculate the thermal conductivity (κ) of the n-$Al_{1-x}In_xN$ samples.

Figure 10:
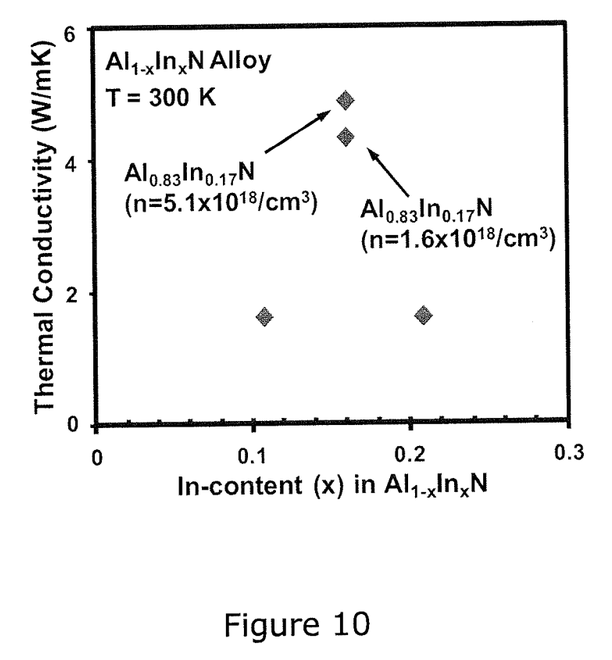
FIG. 10 illustrated the measured thermal conductivities for $Al_{1-x}In_xN$ alloys with various In-contents (x) from x=0.11 up to x=0.2134 at T=300K.

The measured thermal conductivities of Al1-xInxN alloys with x=0.11-0.2134 at T=300 K were shown in FIG. 10. The thermal conductivities of $Al_{1-x}In_xN$ alloys were measured as 1.62 W/(mK), 4.87 W/(mK), 4.31 W/(mK) and 1.62 W/(mK) for x=0.11, 0.17 ($n=5.1\times10^{18}$ cm$^{-3}$), 0.17 ($n=1.6\times10^{18}$ cm$^{-3}$) and 0.2134, respectively. The reduction in the thermal conductivity of $Al_{1-x}In_xN$ with x=0.2134 can be attributed to the increase in the alloy scattering. However, the low thermal conductivity for the $Al_{0.89}In_{0.11}N$ can be attributed to the cracking from the tensile strain in the alloy.

V. Thermoelectric Figures of Merits of AlInN Alloys

Figure 11:
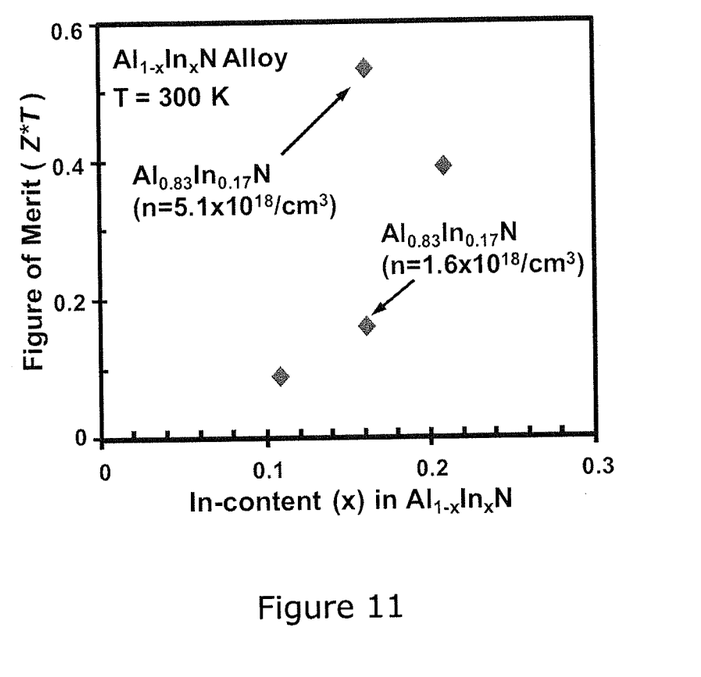
FIG. 11 illustrates the $Z^*T$ values for $Al_{1-x}In_xN$ alloys with various In-contents (x) from x=0.11 up to x=0.2134 at T=300K.

The Z*T=P×T/κ values for n-$Al_{1-x}In_xN$ alloys at T=300 K are shown in FIG. 11. The Z*T values (T=300K) for n-$Al_{1-x}In_xN$ alloys were measured as high as 0.391 up to 0.532. The highest Z*T value (T=300K) was achieved as 0.532 for $Al_{0.83}In_{0.17}N$ ($n=5.1\times10^{18}$ cm$^{-3}$). The Z*T values for $Al_{0.79}In_{0.21}N$ ($n=2.2\times10^{18}$ cm$^{-3}$), $Al_{0.83}In_{0.17}N$ ($n=1.6\times10^{18}$ cm$^{-3}$) and $Al_{0.89}In_{0.11}N$ ($n=1.1\times10^{18}$ cm$^{-3}$) were 0.391, 0.160 and 0.089 respectively.

The thermal conductivities of $Al_{0.83}In_{0.17}N$ with different carrier concentrations are measured as relatively similar, thus the variation of the Z*T values with carrier concentration is attributed to the carrier-concentration-dependent Seebeck and electrical conductivity parameters. The power factor P for $Al_{0.79}In_{0.21}N$ alloy was similar to that of $Al_{0.83}In_{0.17}N$ ($n=1.6\times10^{18}$ cm$^{-3}$), however its low thermal conductivity from the increased alloy scattering led to higher Z*T value of 0.391. For $Al_{0.89}In_{0.11}N$ alloy, the high cracking density of the material led to a reduction of the power factor, which resulted in a lower Z*T value.

In summary, the thermoelectric properties of MOVPE-grown n-$Al_{1-x}In_xN$ (x=0.11-0.2134) alloys are presented. The recorded Z*T values of the $Al_{1-x}In_xN$ alloys were measured as high as 0.391 up to 0.532 at T=300 K, which show significant improvement from RF-sputtered AlInN (Z*T=0.005, T=300 K) and MOVPE-grown InGaN (Z*T=0.08, T=300 K). The improvement observed from the MOVPE-grown AlInN alloys can be attributed to the increase in the Seebeck coefficient and electrical conductivity resulting in higher power factor, in comparison to those measured from MOVPE-grown InGaN and RF-sputtered AlInN. The use of high In-content (x=21.34%) AlInN alloys leads to significant reduction in thermal conductivity [κ=1.62 W/(mK)] due to the increased alloy scattering, however, the use of high In-content AlInN alloys leads to slight reduction in power factor. To optimize the high Z*T value in AlInN material system, it is important to employ crack-free AlInN thin film with large carrier concentration in order to obtain high power factor, while minimizing the thermal conductivity by employing AlInN alloy with In-content in the range of x=15%-22%. The finding indicates that MOVPE-grown AlInN alloy as excellent thermoelectric material for III-Nitride device integration. The In content can be in the range of about 5% to about 50%, and more optimally in the range of about 10% to about 25%, and even more optimally in the range of about 15% to about 19%, and optimally at 17%.

The GaN for the substrate can be undoped or n-type or p-type GaN. Further, the substrate is not limited to GaN but can also be AlN, InGaN, Si, ZnO, or SiC. Although not so limited, the optimal thickness for the GaN template is about 2.8 μm.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. A thermoelectric material, comprising:
a substrate formed of GaN; and
single crystal C-plane AlInN semiconductor material grown directly on said substrate.

2. A thermoelectric material as set forth in claim 1, wherein said single crystal C-plane AlInN semiconductor material is grown on said substrate using metalorganic vapor phase epitaxy.

3. A thermoelectric material as set forth in claim 2, wherein said substrate comprises an undoped or n-type or p-type GaN/sapphire substrate.

4. A thermoelectric material as set forth in claim 3, wherein said GaN/sapphire substrate comprises a GaN template formed on a sapphire substrate.

5. A thermoelectric material as set forth in claim 4, wherein said GaN template is about 2.8 µm thick.

6. A thermoelectric material as set forth in claim 1, wherein said single crystal C-plane AlInN semiconductor material is grown on said substrate by lattice-matching said single crystal C-plane AlInN semiconductor material to said substrate.

7. A thermoelectric material as set forth in claim 1, wherein said single crystal C-plane AlInN semiconductor material has an In-content in the range of about 5% to about 50%.

8. A thermoelectric material as set forth in claim 7, wherein said single crystal C-plane AlInN semiconductor material has an In-content in the range of about 10% to about 25%.

9. A thermoelectric material as set forth in claim 8, wherein said single crystal C-plane AlInN semiconductor material has an In-content in the range of about 15% to about 19%.

10. A thermoelectric material as set forth in claim 9, wherein said single crystal C-plane AlInN semiconductor material has an In-content of 17%.

11. A method of fabricating a thermoelectric material comprising:
forming a substrate of GaN; and
forming a single crystal C-plane AlInN semiconductor material directly on said substrate.

12. The method according to claim 11, wherein said forming of said single crystal C-plane AlInN semiconductor material comprises growing said single crystal C-plane AlInN semiconductor material directly on said substrate using metalorganic vapor phase epitaxy.

13. The method according to claim 12, wherein said substrate comprises an undoped or n-type or p-type GaN/sapphire substrate.

14. The method according to claim 13, wherein said GaN/sapphire substrate comprises a GaN template formed on a sapphire substrate.

15. The method according to claim 14, wherein said GaN template is about 2.8 µm thick.

16. The method according to claim 11, wherein said single crystal C-plane AlInN semiconductor material is formed on said substrate by lattice-matching said single crystal C-plane AlInN semiconductor material to said substrate.

17. The method according to claim 11, wherein said single crystal C-plane AlInN semiconductor material has an In-content in the range of about 5% to about 50%.

18. The method according to claim 17, wherein said single crystal C-plane AlInN semiconductor material has an In-content in the range of about 10% to about 25%.

19. The method according to claim 18, wherein said single crystal C-plane AlInN semiconductor material has an In-content in the range of about 15% to about 19%.

20. The method according to claim 19, wherein said single crystal C-plane AlInN semiconductor material has an In-content of 17%.

21. A thermoelectric material as set forth in claim 1, wherein said single crystal C-plane AlInN semiconductor material is grown directly on said substrate by lattice-matching said single crystal C-plane AlInN semiconductor material to said substrate.

22. A thermoelectric material as set forth in claim 1, wherein said single crystal C-plane AlInN semiconductor material is grown directly on said substrate by nearly lattice-matching said single crystal C-plane AlInN semiconductor material to said substrate.

* * * * *